US006459119B1

(12) United States Patent
Huang et al.

(10) Patent No.: US 6,459,119 B1
(45) Date of Patent: Oct. 1, 2002

(54) CONTACT ARRAY STRUCTURE FOR BURIED TYPE TRANSISTOR

(75) Inventors: Chin-Yi Huang; Yun Chang, both of Hsinchu County (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 09/436,091

(22) Filed: Nov. 8, 1999

Related U.S. Application Data

(62) Division of application No. 09/094,225, filed on Jun. 9, 1998.

(51) Int. Cl.[7] .................................................. H01L 29/76
(52) U.S. Cl. ...................... 257/314; 257/315; 257/316; 257/317; 257/318
(58) Field of Search ............................... 257/315, 316, 257/317, 318, 321, 328, 331; 365/104, 185; 438/266, 257

(56) References Cited

U.S. PATENT DOCUMENTS

| | | | | |
|---|---|---|---|---|
| 4,597,060 A | | 6/1986 | Mitchell et al. ............. | 365/185 |
| 5,117,389 A | * | 5/1992 | Yiu .............................. | 365/104 |
| 5,399,891 A | | 3/1995 | Yiu et al. .................... | 257/316 |
| 5,414,664 A | | 5/1995 | Lin et al. ..................... | 365/218 |
| 5,453,391 A | | 9/1995 | Yiu et al. ...................... | 437/43 |
| 5,526,307 A | | 6/1996 | Yiu et al. ................. | 365/185.01 |
| 5,563,823 A | * | 10/1996 | Yiu et al. ................ | 365/185.16 |
| 5,646,886 A | * | 7/1997 | Brahmbhatt ........... | 365/185.16 |
| 5,747,849 A | * | 5/1998 | Kuroda et al. ............... | 257/321 |
| 5,805,501 A | * | 9/1998 | Shiau et al. ........... | 365/185.29 |
| 6,261,907 B1 | * | 7/2001 | Chang ........................ | 438/266 |

OTHER PUBLICATIONS

Kume, H. et al., "A 1.28$\mu m^2$ Contactless Memory Cell Technology for a 3V–Only 64Mbit EEPROM", IEDM Technical Digest, International Electron Devices Meeting, San Francisco, CA, Dec. 13–16, 1992, pp. 991–993.

Gill, M. et al., "A Novel Sublithographic Tunnel Diode Based 5V–Only Flash Memory", IEDM Technical Digest, International Electron Devices Meeting, San Francisco, CA, Dec. 9–12, 1990, pp. 119–122.

Woo, B.J. et al., "A Novel Memory Cell Using Flash Array Contactless EPROM (Face) Technology", IEDM Technical Digest, International Electron Devices Meeting, San Francisco, CA, Dec. 9–12, 1990, pp. 91–94.

Kazerounian, R. et al., "Alternate Metal Virtual Ground EPROM Array Implemented in a 0.8$\mu m$ Process for Very High Density Applications", IEDM Technical Digest, International Electron Devices Meeting, Washington, D.C., Dec. 8–11, 1991, pp. 311–314.

* cited by examiner

Primary Examiner—Hoai V. Ho
Assistant Examiner—Mai-Huong Tran
(74) Attorney, Agent, or Firm—Mark A. Haynes; Haynes Beffel & Wolfeld LLP

(57) ABSTRACT

Systems and methods are described for providing an array of buried transistor cells with at least one contact array structure. A contact array structure for a buried type transistor array includes a first diffusion bit line coupled to the plurality of transistors; a first plurality of contacts coupled to the source diffusion bit line; and a first conductor coupled to the first plurality of contacts. The systems and methods provide advantages in that the diffusion line resistance is reduced, the read current and speed are reduced, and the voltage-time distribution is tightened when writing by hot electron programming.

6 Claims, 13 Drawing Sheets

CONTACT ARRAY STRUCTURE FOR BURIED TYPE TRANSISTOR

This application is a division of U.S. patent application Ser. No. 09/094,225, filed Jun. 9, 1998.

BACKGROUND OF THE INVENTION

1. Field of the Invention

The present invention relates generally to the field of buried transistor circuits. More particularly, the present invention relates to an array of buried transistor cells including diffusion bit lines that are provided with a contact array structure for reducing resistance along the diffusion bit lines. Specifically, a preferred implementation of the present invention relates to floating gate (e.g., FLASH EPROM) memories that include a contact array structure that parallels one, or more, diffusion bit lines.

2. Discussion of the Related Art

It has been known in the field of microelectronics to connect buried transistors with diffusion bit lines. Prior art diffusion bit lines, sometimes called bit lines, are well known to those skilled in the art. U.S. Pat. Nos. 4,597,060; 5,399,891; 5,453,391; and 5,526,307, disclose floating gate memory circuits composed of buried transistor cells connected together with diffusion bit lines.

For instance, referring to FIG. 2, a conventional floating gate memory buried transistor subarray structure 200 is shown where the transistor cells are connected together with source diffusion areas and drain diffusion areas. The diffusion areas function as diffusion bit lines.

Still referring to FIG. 2, the conventional floating gate memory buried transistor subarray structure 200 includes a plurality of word lines 210. The plurality of word lines 210 function as the gates of the transistor cells that compose the conventional floating gate memory buried transistor subarray structure 200. Each of the plurality of word lines 210 passes over two channel areas 230. Between each of the plurality of word lines 210 and each of the two channel areas 230 is a floating gate (not shown). Thus, each of the plurality of word lines 210 is connected to two floating gates, and, therefore, two transistor cells. A source diffusion area 240 is located between the two channel areas 230. The source diffusion area 240 functions as the source for the transistors that compose the conventional floating gate memory buried transistor subarray structure 200. A pair of drain diffusion areas 250 are located next to the two channel areas 230. The pair of drain diffusion areas 250 are opposite the source diffusion area 240 with regard to the two channel areas 230. The pair of drain diffusion area 250 functions as the drain of the transistors that compose the conventional floating gate memory buried transistor subarray structure 200. A pair of isolation structures 260 are located adjacent to the pair of drain diffusion areas 250. Thus, the conventional floating gate memory buried transistor subarray structure 200 is depicted as having one subarray structure that includes two columns of transistor cells. The transistor cells in both columns share a common source diffusion bit line (i.e., the source diffusion area 240).

As represented in FIG. 2, each of the two channel areas 230 includes a plurality of dots. Each series of dots indicates that the conventional floating gate memory buried transistor subarray structure 200 can be expanded to include additional word lines. In addition, the conventional floating gate memory buried transistor subarray structure 200 can be expanded by extending the plurality of word lines 210 to the right and/or left to so that the conventional floating gate memory buried transistor subarray structure 200 would include additional column pairs.

Referring now to FIG. 3, a cross-section of the structure illustrated in FIG. 2, taken along the section line labeled B–B' in FIG. 2, is depicted. In FIG. 3, one of the plurality of word lines 210 runs continuously from one end of the structure to the other. The one of the plurality of word lines 210 is isolated from a pair of polywings 220 by an inter-poly dielectric 310. A pair of floating gates 330 are located beneath the pair of polywings 220 and are made of a first type of polycrystalline silicon (i.e., poly 1). The one of the plurality of word lines 210 is made of a second polycrystalline silicon (i.e. poly 2). The pair of polywings 220 are also made of polycrystalline silicon. The source diffusion area 240 and the pair of drain diffusion areas 250 are located beneath a buried diffusion BD oxide 320. The BD oxide 320 includes the pair of isolation structures 260. The two channel areas 230 are located below the pair of floating gates 330.

Referring now to FIG. 4 a cross-section of the structure illustrated in FIG. 2, taken along the section line labeled C–C' in FIG. 2, is depicted. In FIG. 4, each of the plurality of word lines 210 is separated by a spacer oxide 410. The plurality of word lines 210 and the spacer oxide 410 are formed on the BD oxide 320. The pair of drain diffusion areas 250 are located beneath the BD oxide 320.

As represented in FIG. 4, there are a series of dots to the right and left of the plurality of word lines 210. Each series of dots indicates that the conventional floating gate memory buried transistor subarray structure 200 can be expanded to include additional word lines. In addition, the conventional floating gate memory buried transistor subarray structure 200 can be expanded by adding additional word lines to the right and/or left. A global bit line 420 is located above, and spaced apart from the plurality of word lines 210.

A previously recognized problem with this diffusion bit line technology has been there can be significant voltage drops along such bit lines. Specifically, the voltage drop is severe for high current applications such as, for example, writing with hot electron programming on EPROM or FLASH EPROM circuits. Therefore, what is required is solution that reduces the electronic resistance of such diffusion bit lines.

Another previously recognized problem with this diffusion bit line technology has been that the read current and the read speed of circuits with longer buried diffusion lines are too low. Therefore, what is also required is a solution that enhances the read current and read speed with longer buried diffusion lines.

Another previously recognized problem with this diffusion bit line technology has been that the voltage/time (VT) distribution when writing to transistors connected with such buried diffusion lines by means of hot electron programming is unsatisfactorily wide. This is due to the large number of transistors that can be connected in parallel to such diffusion bit lines. Therefore, what is also required is a solution that tightens the voltage/time (VT) distribution when writing with hot electron programming.

Heretofore, the above-discussed requirements of reduced resistance, improved read current and speed, and tightened VT distribution have not been fully met. What is needed is a solution that simultaneously addresses these requirements.

SUMMARY OF THE INVENTION

A primary object of the invention is to provide reduced resistance along diffusion bit lines that interconnect buried transistors. Another primary object of the invention is to provide improved read current and speed for buried transistor arrays. Another primary object of the invention is to provide a tightened VT distribution when hot electron programming buried transistor memory circuits.

Therefore, there is a particular need to provide circuits that contain a buried transistor array with a contact array structure. Thus, it is rendered possible to simultaneously satisfy the above-discussed requirements of reduced resistance, improved read current and speed, and tightened VT distribution, which in the case of the prior art cannot be simultaneously satisfied.

A first aspect of the invention is implemented in an embodiment based on a method of operating a plurality of transistor cells with a contact array structure, comprising: applying a first voltage to a nonglobal conductor that is electrically coupled to a first plurality of transistor cells via a first plurality of contacts and a first diffusion bit line, wherein said first plurality of contacts is coupled to said nonglobal conductor, said first diffusion bit line is coupled to said first plurality of contacts, and said first plurality of transistor cells is coupled to said first diffusion bit line. A second aspect of the invention is implemented in an embodiment based on a floating gate memory, comprising a plurality of blocks of transistor cells, each of said plurality of blocks including a plurality of subarrays of transistor cells, each of said plurality of subarrays of transistor cells including: a first plurality of buried transistor cells; a first drain diffusion bit line coupled to said first plurality of buried transistor cells; a first plurality of contacts coupled to said first drain diffusion bit line; a first nonglobal conductor coupled to said first plurality of contacts; a source diffusion bit line coupled to said first plurality of transistors; a second plurality of contacts coupled to said source diffusion bit line; a second nonglobal conductor coupled to said second plurality of contacts; a second plurality of buried transistor cells coupled to said source diffusion bit line; a second drain diffusion bit line coupled to said second plurality of buried transistor cells; a third plurality of contacts coupled to said second drain diffusion bit line; and a third nonglobal conductor coupled to said third plurality of contacts. A third aspect of the invention is implemented in an embodiment based on a contact array structure for a plurality of transistors, comprising: a first diffusion bit line coupled to said plurality of buried transistors; a first plurality of contacts coupled to said first diffusion bit line; and a first nonglobal conductor coupled to said first plurality of contacts.

These, and other, objects and aspects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

A clear conception of the advantages and features constituting the present invention, and of the components and operation of model systems provided with the present invention, will become more readily apparent by referring to the exemplary, and therefore nonlimiting, embodiments illustrated in the drawings accompanying and forming a part of this specification, wherein like reference numerals (if they occur in more than one view) designate the same elements. It should be noted that the features illustrated in the drawings are not necessarily drawn to scale.

DESCRIPTION OF PREFERRED EMBODIMENTS

The present invention and the various features and advantageous details thereof are explained more fully with reference to the nonlimiting embodiments that are illustrated in the accompanying drawings and detailed in the following description. Descriptions of well known components and processing techniques are omitted so as not to unnecessarily obscure the present invention in detail.

A detailed description of a preferred embodiment of the invention is provided with respect to FIGS. 1 and 5–9. In general, the invention is directed to incorporating embedded contacts and conductors associated therewith into electrical contact with one, or more, buried diffusion bit lines. The contacts are structures that function as electronic conduits. The contacts and the associated conductors are configured to provide at least one route of lower resistance compared to the situation where only the buried diffusion bit lines are present.

Figure 1:
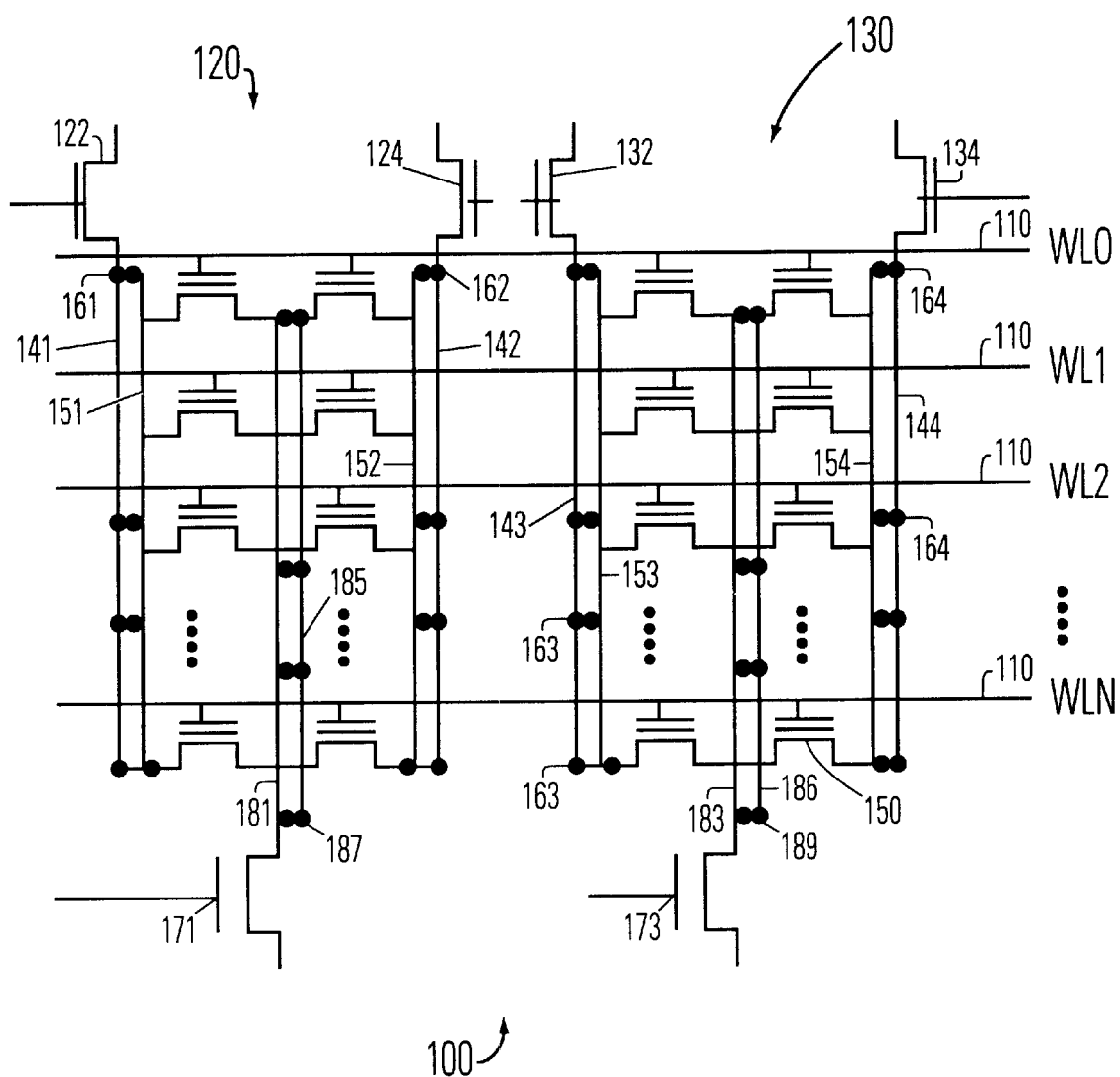
FIG. 1 illustrates an electrical schematic view of a floating gate memory array circuit, representing an embodiment of the invention.
Figure 2:
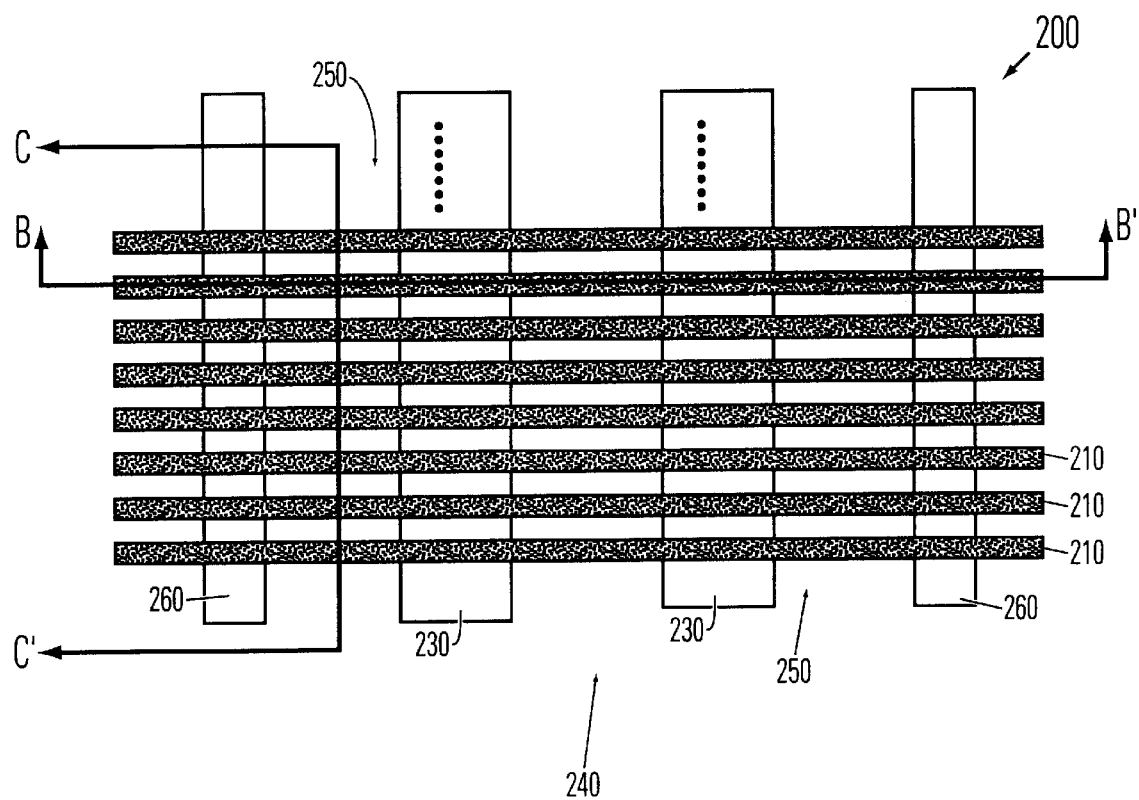
FIG. 2 illustrates a schematic top view of a conventional floating gate memory subarray structure, appropriately labeled "prior art."
Figure 3:
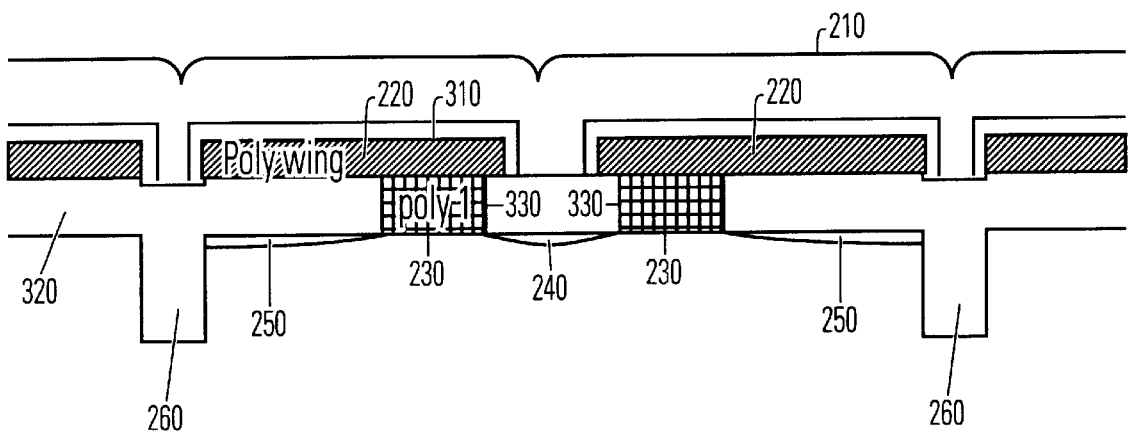
FIG. 3 illustrates a schematic cross-section view of the subarray structure shown in FIG. 2 (taken along the section line labeled B–B'), appropriate labeled "prior art."
Figure 4:
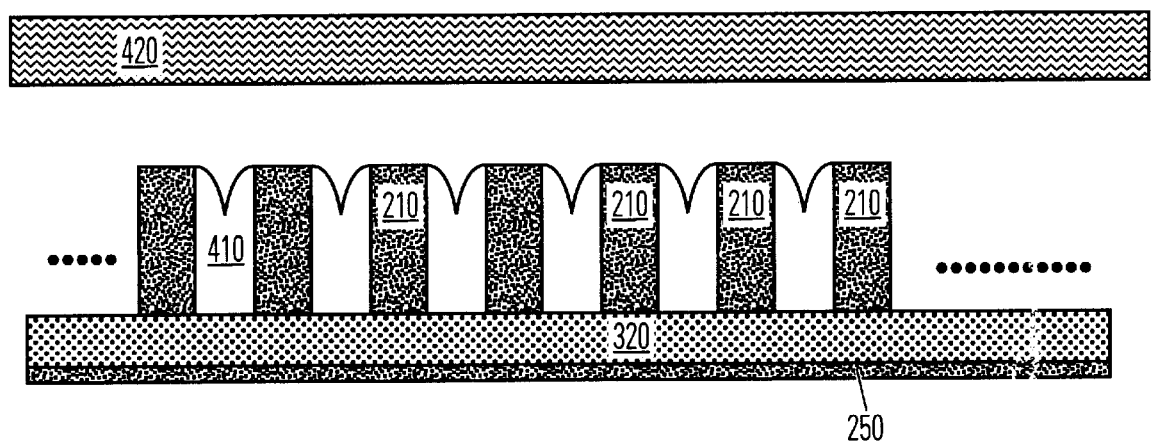
FIG. 4 illustrates a schematic cross-section view of the subarray structure shown in FIG. 2 (taken along the section line labeled C–C'), appropriately labeled "prior art."

Referring now to FIG. 1, a schematic circuit diagram representing an embodiment of the invention is depicted. A floating gate memory transistor cell array 100 includes a plurality of word lines 110. The plurality of word lines 110 are labeled WL0, WL1, W12, WLN. The floating gate memory transistor cell array 100 includes a first subarray 120 and a second subarray 130. Each of the plurality of word lines 110 passes over both the first subarray 120 and the second subarray 130. The plurality of word lines 110 function as the gates of the transistor cells that compose the floating gate memory buried transistor array 100. The first subarray 120 includes a first drain block select transistor 122 and a second drain block select transistor 124. The first drain block select transistor 122 and the second drain block select transistor 124 are connected to a first global bit line (not shown in FIG. 1). The second subarray 130 includes a third drain block select transistor 132 and a fourth drain block select transistor 134. The third drain block select transistor 132 and the fourth drain block select transistor 134 are connected to a second global bit line (not shown in FIG. 1). The first subarray 120 includes two columns of floating gate memory cells. The second subarray 130 includes two columns of floating gate memory cells. Each of the columns of floating gate memory cells includes a plurality of floating gate memory transistors 150.

Still referring to FIG. 1, the first drain block select transistor 122 is connected to a first conductor 141. The first conductor 141 is connected to a first drain diffusion bit line 151 via a first plurality of contacts 161. The second drain block select transistor 124 is connected to a second conductor 142. The second conductor 142 is connected to a second drain diffusion bit line 152 via a second plurality of contacts 162. The third drain block select transistor 132 is connected to a third conductor 143. The third conductor 143 is connected to a third drain diffusion bit line 153 via a third plurality of contacts 163. The fourth drain block select transistor 134 is connected to a fourth conductor 144. The fourth conductor 144 is connected to a fourth drain diffusion bit line 154 via a fourth plurality of contacts 164. The first subarray 120 includes a first source block select transistor 171. The source block select transistor 171 is connected to a fifth conductor 181. The fifth conductor 181 is connected to a first source diffusion bit line 185 via a fifth plurality of contacts 187. A source of each of the plurality of floating gate memory transistors 150 that composes the first subarray 120 is connected to the first source diffusion bit line 185. Similarly, a drain of each of the plurality of floating gate memory transistors 150 that composes the first subarray 120 is connected to either the first drain diffusion bit line 151 or the second drain diffusion bit line 152 depending on the column in which that transistor resides.

Still referring to FIG. 1, the second subarray 130 includes a second source block select transistor 173. The second source block select transistor 173 is connected to a sixth conductor 183. The sixth conductor 183 is connected to a second source diffusion bit line 186 via a sixth plurality of contacts 189. A source of each of the plurality of floating gate memory transistors 150 that composes the second subarray 130 is connected to the second source diffusion bit line 186. Similarly, a drain of each of the plurality of floating gate memory transistors 150 composing the second subarray 130 is connected to either the third drain diffusion bit line 153 or the fourth drain diffusion bit line 154 depending on the column in which that transistor resides. The first source block select transistor 171 and the second source block select transistor 173 are connected to a third global bit line (not shown in FIG. 1).

The conductors 141–144, 181 and 183 can be segmented so as to be isolated from one another (e.g., run for only the length of the column with which they are associated). Therefore, the conductors 141–144, 181 and 183 can be termed nonglobal. Preferably, the conductors 141–144, 181, 183 are physically routed on a metalization level (layer) that is located above the diffusion bit lines 151–154 and 185–186. The first, second, and third global bit lines can be physically routed on either i) the metalization level on which the conductors 141–144, 181, 183 are located or ii) the metalization level on which the diffusion bit lines 151–154, 185–186 are located. In view of the fact that the global bit lines are connected to the conductors 141–144, 181, 183 via transistors 122, 124, 132, 134, 171 and 173, the global bit lines are preferably routed on the same metalization level as the. conductors 141–144, 181 and 183. The first, second, and third global bit lines can extend throughout the block in which the array is located. Further, the global bit lines can extend throughout the entire chip in which the block is located.

Still referring to FIG. 1, it can be appreciated that the presence of the various conductor structures provides a parallel flow route for the electrons flowing to or from a given floating gate memory transistor (i.e., a given transistor cell). By making the contact structures longer, the physical location of the conductor structures can be displaced with regard to the diffusion bit line structures. For instance, by making the fifth plurality of contacts 187 and sixth plurality of contacts 189 longer, the physical location of the fifth conductor 181 and the sixth conductor 183 can be physically displaced with regard to the first source diffusion bit line 185 and the second source diffusion bit line 186 (e.g., the conductive structures could be moved up and away from the transistor cells). By displacing the fifth conductor 181 and the sixth conductor 183, conductive structures of larger cross-sectional area, and therefore lowe[00f8] resistance, can be provided as the fifth conductor 181 and the sixth conductor 183 without crowding either the floating gate memory transistors or the diffusion bit lines. This permits a higher density of transistor cells per unit area while simultaneously improving electron flow. The thermal characteristics of the floating gate memory transistor cell array 100 may also be improved due to the displacement and/or presence of the conductive structures.

Figure 5:
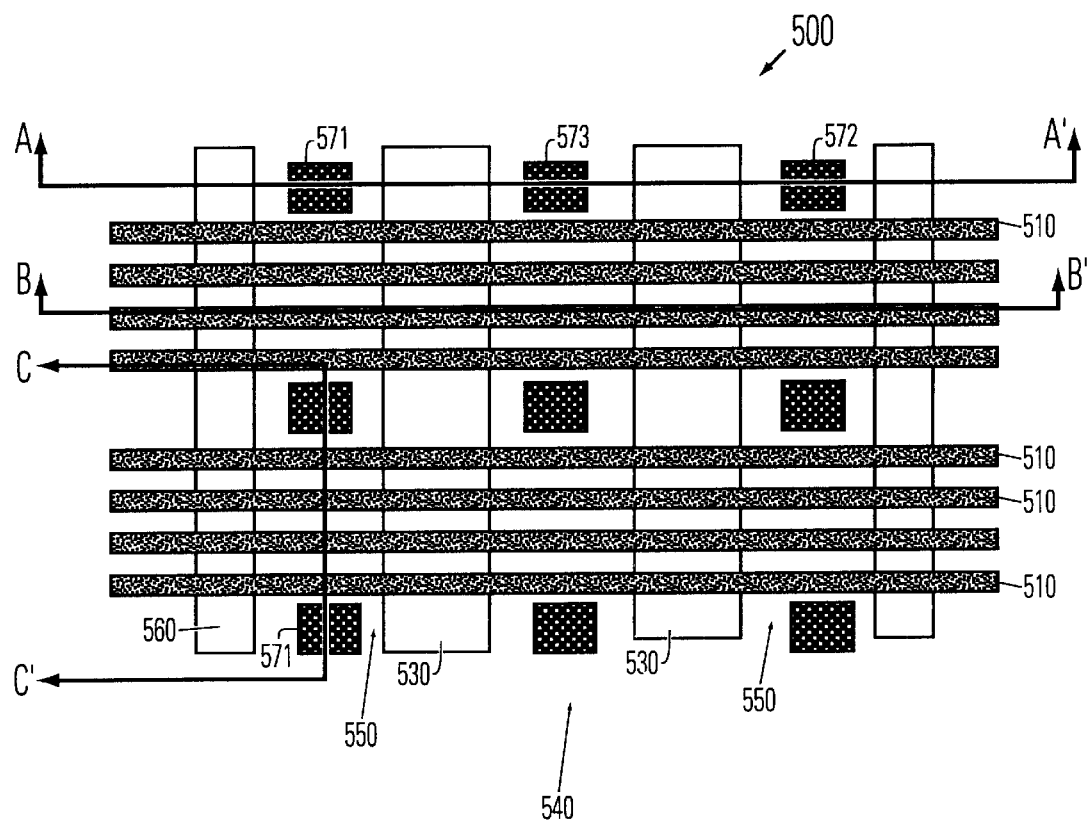
FIG. 5 illustrates a schematic top view of a floating gate memory subarray structure that includes a contact array structure, representing an embodiment of the invention.

Referring now to FIG. 5, a schematic top view of a subarray structure 500 representing an embodiment of the invention is depicted. The subarray structure 500 includes a plurality of word lines 510. The plurality of word lines 510 function as the gates of the transistor cells that compose the subarray structure 500. Each of the plurality of word lines 510 passes over a pair of channel areas 530. Between each of the plurality of word lines 510 and each of the pair of channel areas 530 is a floating gate (not shown in FIG. 5). Thus, each of the word lines 510 is connected to two floating gates. A source diffusion area 540 is located between the two channel areas 530. The source diffusion area 540 functions as the source for the transistors that compose the subarray structure 500 and as a source diffusion bit line. A pair of drain diffusion areas 550 are located next to the pair of channel areas 530. The pair of drain diffusion areas 550 are opposite the source diffusion area 540 with regard to the pair of channel areas 530. The pair of drain diffusion area 550 function as the drains for the transistors that compose the subarray structure 500 and as drain diffusion bits lines. A pair of isolation structures 560 are located adjacent to the pair of drain diffusion areas 550.

Still referring to FIG. 5, a first of the pair of drain diffusion areas 550 (located to the left of the source diffusion area 540) is coupled to a first plurality of contacts 571. A second of the pair of drain diffusion areas 550 (located to the right of the source diffusion area 540) is coupled to a second plurality of contacts 572. Similarly, the source diffusion area is coupled to a third plurality of contacts 573. These contact structures function as electronic conduits between the diffusion areas and overlying conductors (not shown in FIG. 5). The presence of these contact structures in conjunction with the conductive structures (described above with regard to FIG. 1) provides enhanced electronic conductance for the source and drain of the transistor cells that compose the array, especially for transistor cells located further upstream with regard to the flow of electrons along the diffusion areas.

Still referring to FIG. 5, the invention is not limited to the particular configuration depicted. Additional word lines con be added to the subarray. Similarly, the subarray 500 can be expanded to the left and/or right to include additional column pairs. Most importantly, additional contact structures can be added to (or deleted from) the diffusion areas.

The contact structures can be made of any suitable low electrical resistance material. The contact structures can be fabricated as diffusion bit lines. Conveniently, the contacts of the invention can be made of any metallic material (e.g., aluminum and/or copper alloys) with or without barrier layers, or an appropriately doped metal oxide, or even a superconductor or a conductive polymer. For the manufacturing operation, it is moreover an advantage to employ a material that will couple well with the diffusion areas.

However, the particular material selected for contact structures is not essential to the present invention, as long as it provides the described function in conjunction with the conductors and diffusion areas to which they are electrically coupled. Normally, those who make the contact structures will select the best commercially available material based upon the economics of cost and availability, the expected application requirements of the final product, and the demands of the overall manufacturing process.

Figure 6:
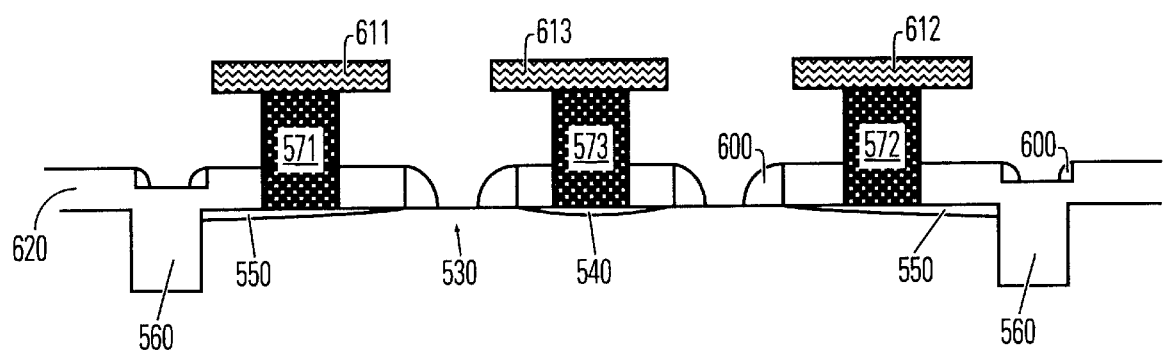
FIG. 6 illustrates a schematic cross-section view of the subarray structure shown in FIG. 5 (taken along the section line labeled A–A'), representing an embodiment of the invention.

Referring now to FIG. 6, a cross-section of the structure illustrated in FIG. 5, taken along the section line labeled A–A' in FIG. 5, is depicted. None of the plurality of word lines 510 is visible in FIG. 6 because of the location at which the section was taken. One of the first plurality of contacts 571, one of the second plurality of contacts 572, and one of the third plurality of contacts 573 can be seen in FIG. 6. A BD oxide 620 surrounds the contacts. The BD oxide includes the pair of isolation structures 560. A plurality of spacers 600 are adjacent edges of the BD oxide 620.

Still referring to FIG. 6, the contacts penetrate through the BD oxide 620 to obtain electronic coupling with the respective diffusion areas. Specifically, the one of the first plurality of contacts 571 and the one of the second plurality of contacts 572 penetrates the BD oxide 620 to electrically couple with the pair of drain diffusion areas 550. The one of the third plurality of contacts 573 penetrates the BD oxide 620 to electrically couple with the source diffusion area 540. There can be a coating or other structure between the contacts and the diffusion areas. The one of the first plurality of contacts 571 is electrically coupled to a first conductor 611. The one of the second plurality of contacts 572 is electrically coupled to a second conductor 612. The one of the third plurality of contacts 573 is electrically coupled to a third conductor 613. There can be a coating or other structure between the conductors and the contacts.

The conductor structures (i.e., conductors 611–613) can be made of any suitable conductive material. The conductor structures can be fabricated as diffusion bit lines. Conveniently, the conductor structures of the invention can be made of any metallic material (e.g., aluminum alloy and/or copper alloy) with or without barrier layers, or an appropriately doped metal oxide, or even a superconductor or a conductive polymer. For the manufacturing operation, it is moreover an advantage to employ a material that will bond well with the contact structures.

However, the particular material selected for conductor structures is not essential to the present invention, as long as it provides the described function in conjunction with the contacts with which they are coupled. Normally, those who make the conductor structures will select the best commercially available material based upon the economics of cost and availability, the expected application requirements of the final product, and the demands of the overall manufacturing process.

Figure 7:
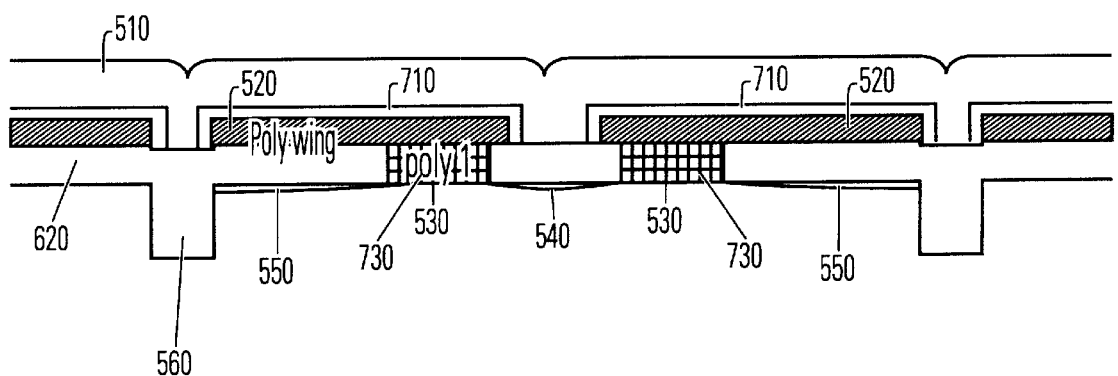
FIG. 7 illustrates a schematic cross-section view of the array structure shown in FIG. 5 (taken along the section line labeled B–B'), representing an embodiment of the invention.

Referring now to FIG. 7, a cross-section of the structure illustrated in FIG. 5, taken along the section line labeled B–B' in FIG. 5, is depicted. One of the plurality of word lines 510 is visible in FIG. 7. The one of the plurality of word lines 510 is isolated from a pair of polywings 520 by a pair of inter-poly dielectrics 710. A pair of floating gates 730 are located beneath the pair of inter-poly dielectric wings 520. The pair of channel areas 530 are located beneath the pair of floating gates 730. The source diffusion area 540 and the pair of drain diffusion areas 550 are located beneath the BD oxide 620 and near the diffusion areas. The pair of floating gates 730 are made of a first type of polycrystalline silicon (i.e., poly 1). The one of the plurality of word lines 510 is made of a second polycrystalline silicon (i.e., poly 2). The polywings 520 are also made of polycrystalline silicon.

Figure 8:
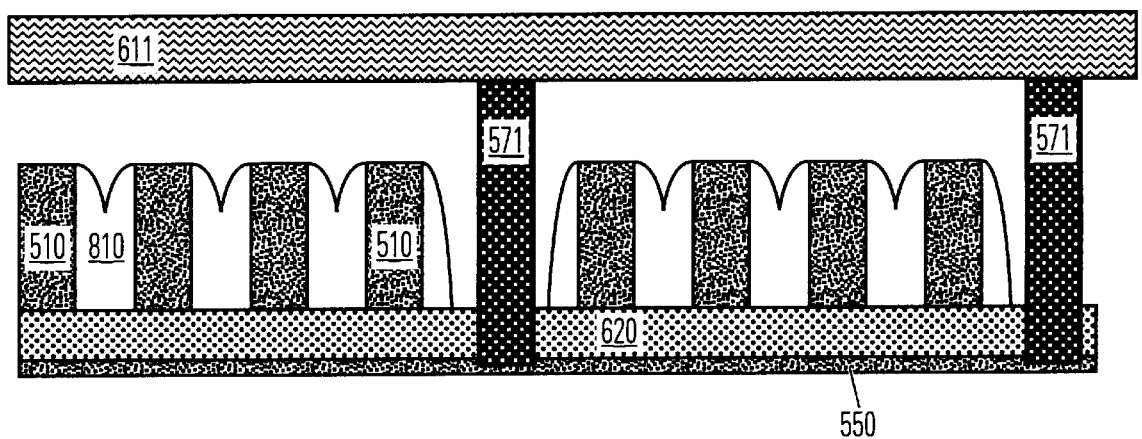
FIG. 8 illustrates a schematic cross-section view of the array structure shown in FIG. 5 (taken along the section line labeled C–C'), representing an embodiment of the present invention.

Referring now to FIG. 8, a cross-section of the structure illustrated in FIG. 5, taken along the section line labeled C–C' in FIG. 5, is depicted. Each of the plurality of word lines 510 is separated by a spacer oxide 810. The plurality of word lines 510 and the spacer oxide 810 are formed on the BD oxide 620. One of the pair of drain diffusion areas 550 is visible in FIG. 8 beneath the BD oxide 620. The first plurality of contacts 571 penetrates the BD oxide 620 so as to be electronically coupled to the one of the pair of the drain diffusion areas 550 that is visible in FIG. 8. The first plurality of contacts 571 is coupled to a first conductor 611. Of course, the first conductor 611 is not a global bit line.

Figure 9:
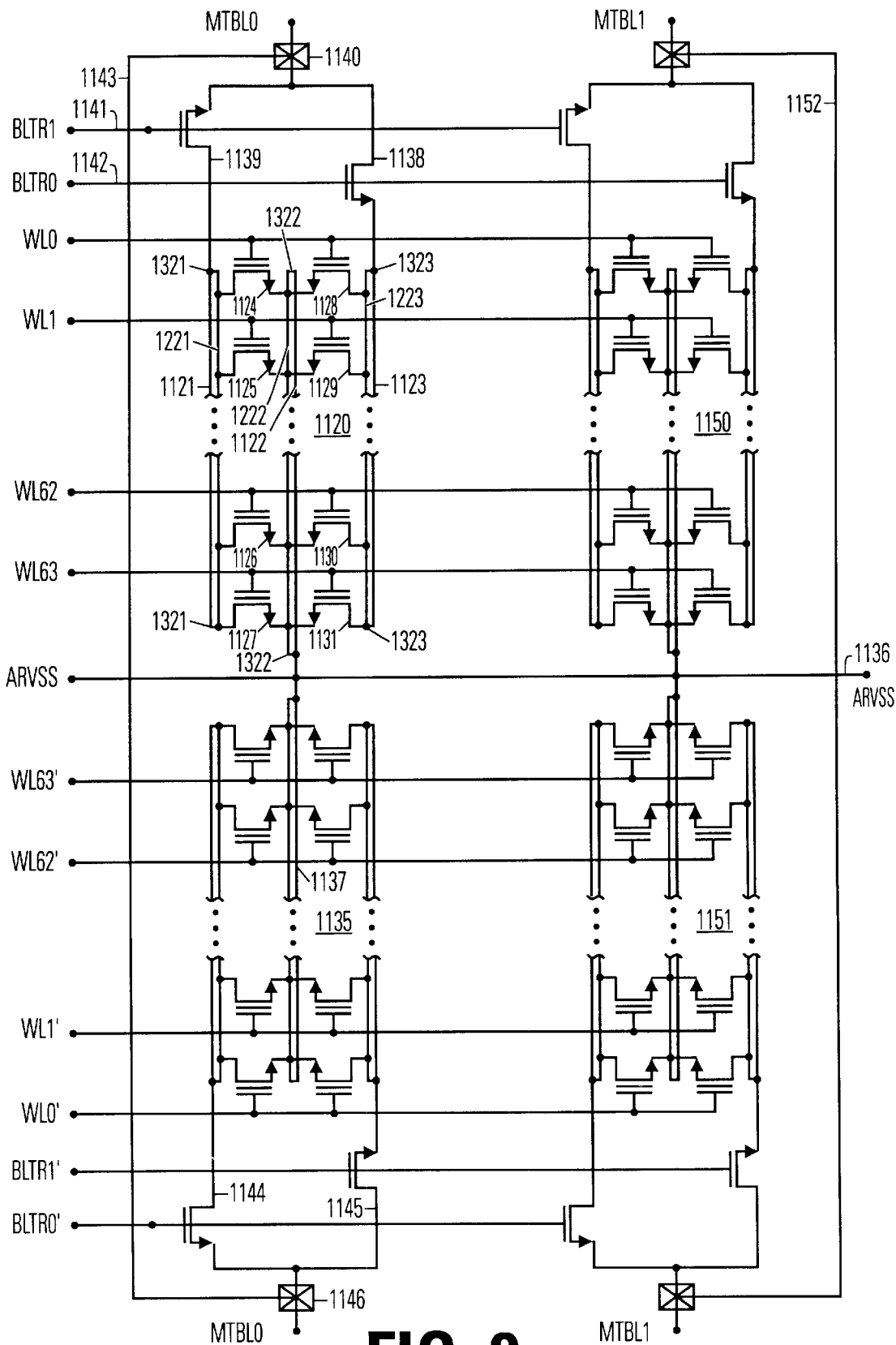
FIG. 9 illustrates a schematic diagram of an alternative embodiment of the present invention with two columns of flash EPROM cells sharing a single metal bit line.

Referring now to FIG. 9, an alternative architecture of the floating gate memory array according to the present invention is depicted in which two columns of flash EPROM cells share a single metal bit line. FIG. 9 shows four pairs of columns of the array, where each pair of columns includes flash EPROM cells in a drain-source-drain configuration.

Thus, the first pair 1120 of columns includes a first conductor 1121, a second conductor 1122, and a third conductor 1123. The first conductor 1121 is connected in parallel to a first drain diffusion line 1221 via a first plurality of contacts 1321. The second conductor 1122 is connected in parallel to a source diffusion line 1222 via a second plurality of contacts 1322. The third conductor 1123 is connected in parallel to a second drain diffusion line 1223 via a third plurality of contacts 1323. Word lines WL0 through WL63 each overlay the floating gates of a cell in a first one of the pairs of columns and a cell in the second one of the pairs of columns. As shown in the figure, the first pair 1120 of columns includes one column including cell 1124, cell 1125, cell 1126, and cell 1127. Not shown are cells coupled to word lines WL2 through WL61. Also not shown are additional contacts that compose the first plurality of contacts 1321, the second plurality of contacts 1322, and the third plurality of contacts 1323. The second one of the pair 1120 of columns includes cell 1128, cell 1129, cell 1130, and cell 1131. Along the same column of the array, a second pair 1135 of columns is shown. It has a similar architecture to the pair 1120 of columns except that it is laid out in a mirror image. Optionally, one or more source block select transistors (not shown in FIG. 9) can connect the second conductor 1122 to a ground diffusion 1136.

Thus, as can be seen, the transistor in the first one of the pair of columns, such as the cell 1125, includes a drain in drain diffusion line 1221, and a source in the source diffusion line 1222. A floating gate overlays the channel region between the first drain diffusion line 1221 and the source diffusion line 1222. The word line WL1 overlays the floating gate of the cell 1125 to establish a flash EPROM cell.

The column pair 1120 and column pair 1135 share an array virtual ground diffusion 1136 (ARVSS). Thus, the source diffusion line 1222 of column pair 1120 is coupled to the ground diffusion 1136. Similarly, the source diffusion line 1137 of column pair 1135 is coupled to the ground diffusion 1136.

As mentioned above, each pair 1120 of columns of cells shares a single metal line. Thus, a block right select transistor 1138 and a block left select transistor 1139 are included. The transistor 1139 includes a drain in the first conductor 1121, a source coupled to a metal contact 1140, and a gate coupled to the control signal BLTR1 on line 1141. Similarly, the right select transistor 1138 includes a source in the third conductor 1123, a drain coupled to the metal contact 1140, and a gate coupled to the control signal BLTR0 on line 1142. Thus, the select circuitry, including transistors 1138 and 1139, provides for selective connection of the first conductor 1121 and the third conductor 1123 to the metal line 1143 (MTBL0) through metal contact 1140. As can be seen, column pair 1135 includes left select transistor 1144 and right select transistor 1145 which are similarly connected to a metal contact 1146. Contact 1146 is coupled to the same metal line 1143 as is contact 1140 which is coupled to column pair 1120. The metal line 1143 can be termed a global bit line and can be made of aluminum. The metal line 1143 can be shared by more than two columns of cells with additional select circuitry.

The architecture shown in FIG. 9 is based upon a drain-source-drain unit forming two columns of cells which are isolated from adjacent drain-source-drain units to prevent leakage current from adjacent columns of cells. The architecture can be extended to units of more than two columns, with appropriate tolerances for leakage current in the sensing circuitry, or other controls on current leakage from unselected cells. Thus, for instance, fourth and fifth diffusion lines could be added within a given isolated region to create a drain-source-drain-source-drain structure which provides four columns of cells.

Column pairs are laid out horizontally and vertically to provide an array of flash EPROM cells comprising M word lines and 2N columns. The array requires only N metal bit lines each of which is coupled to a pair of columns of flash EPROM cells through select circuitry, as described above.

Although FIG. 9 only shows four column pairs 1120, 1135, 1150, and 1151, coupled to two metal bit lines 1143 and 1152 (MTBL0–MTBL1), the array may be repeated horizontally and vertically as required to establish a large scale flash EPROM memory array. Thus, column pairs 1120 and 1150 which share a word line are repeated horizontally to provide a segment of the array. Segments are repeated vertically. A group of segments (e.g., eight segments) having respective word lines coupled to a shared word line driver may be considered a sector of the array.

The layout of the array is compact because of the virtual ground configuration, the reduced metal pitch requirement fir the layout, and further by the ability to share word line drivers amongst a plurality of rows in different segments. Thus, word line WL63' may share a word line driver with word line WL63. In a preferred system, eight word lines share a single word line driver. Thus, only the pitch of one word line driver circuitry is needed for each set of eight rows of cells. The additional decoding provided by the left and right select transistors (1139, 1138 for segment 1120) allows the shared word line configuration. The shared word line configuration has the disadvantage that during a sector erase operation, eight rows of cells all receive the same word line voltage, causing a word line disturbance in cells that are not desired to be erased. If it is a problem for a given array, this disturbance problem can be eliminated by insuring that all sector erase operations decode for segments including all rows of cells coupled to the shared word line drivers. For eight word lines sharing a single driver, a minimum sector erase of eight segments may be desired.

Figure 10:
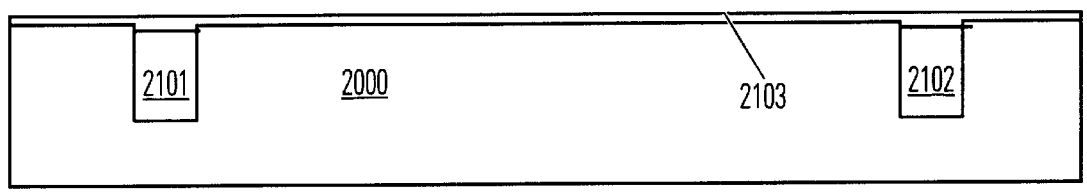
FIG. 10 illustrates a schematic cross-section view of a first stage in fabricating an array structure, representing an embodiment of the invention.
Figure 11:
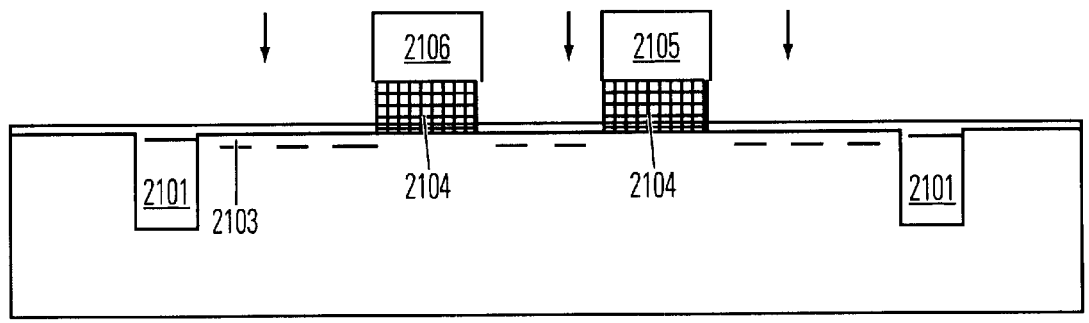
FIG. 11 illustrates a schematic cross-section view of a second stage in fabricating the array structure shown in FIG. 10, representing an embodiment of the present invention.

FIG. 10 illustrates a first step in the process to fabricate the contact array structure and starts with a P-type substrate 2000. A trench isolation process is used to form isolation regions 2101 and 2102. A thin tunnel oxide 2103 is grown about 100 angstroms thick. As illustrated in FIG. 11, a poly 1 layer 2104 is deposited and a photo masking process is used to define gates, a n+ source and a n+ drain diffusion regions. The poly 1 layer 2104 is etched away except as protected by masks 2105 and 2106 to expose drain and source areas. Next, a n-type dopants are implanted through the exposed regions. Therefore, these regions are self-aligned with regard to floating gates and isolation regions.

Figure 12:
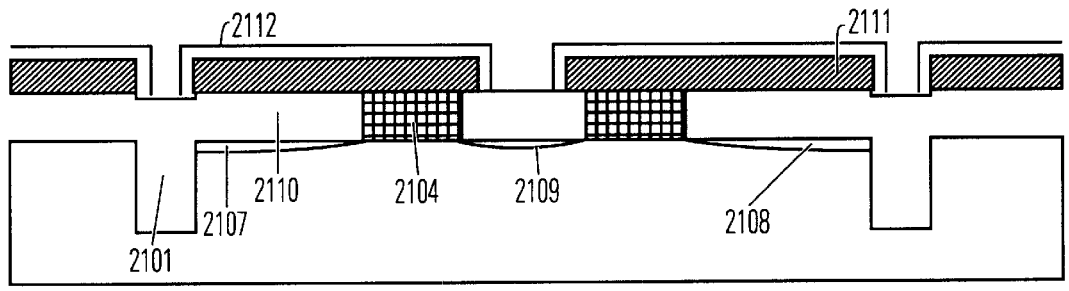
FIG. 12 illustrates a schematic cross-section view of a third stage in fabricating the array structure shown in FIGS. 10–11, representing an embodiment of the present invention.
Figure 13:
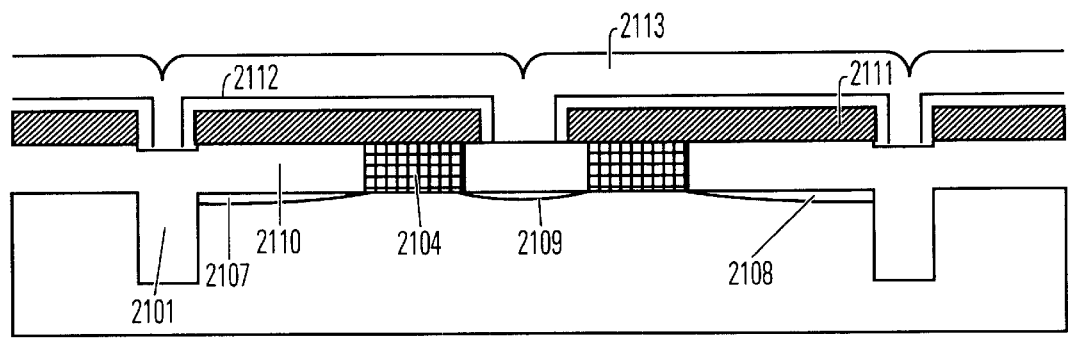
FIG. 13 illustrates a schematic cross-section view of a fourth stage in fabricating the array structure shown in FIGS. 10–12, representing an embodiment of the present invention.
Figure 14:
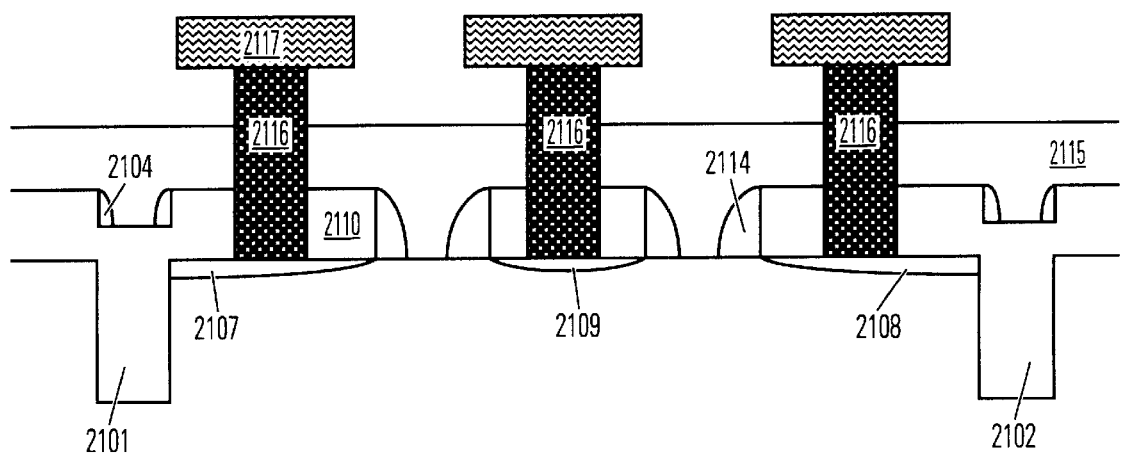
FIG. 14 illustrates a schematic cross-section view of a fifth stage in fabricating the array structure shown in FIGS. 10–13, representing an embodiment of the present invention.

As illustrated in FIG. 12, the substrate is annealed to activate the dopants and define drain regions 2107 and 2108, and source region 2109. Also, a thick chemical vapor deposition CVD oxide film 2110 is deposited and etched on top of poly 1 layer 2104. Next, a poly wing region 2111 is deposited as a second layer of polysilicon. A photo masking processes used to define the poly wing region 2111 to increase the gate coupling ratio. In the next step, an oxide-nitride-oxide ONO layer 2112 about 130 angstroms thick is grown. As illustrated in FIG. 13, which is a cross-section view through a word line, a third layer of polysilicon 2113 is deposited and etched to define the transistors. FIG. 14 illustrates a cross-section view through contact regions between two polysilicon 2113 areas (i.e., word lines). A CVD oxide layer 2114 is formed as a spacer and a flow dielectric 2115 is deposited and caused to flow. The dielectric material of CVD oxide can be borophosphosilicate glass BPSG, phosphosilicate glass PSG or other flowable insulator material. Next, a photo masking process is used to define contact regions 2116. The contact material can be tungsten, polysilicon and/or aluminum. The form of the contact material can define a plug. After the contact formation, a metalization layer 2117 is deposited to form an interconnection layer. The material of metalization layer can be aluminum and/or tungsten. Finally, a passivation layer (not shown) can be deposited over the metalization layer 2117.

The particular manufacturing process used for fabricating the contact array should be inexpensive and reproducible. Conveniently, the contact array of the present invention can be carried out by using any vacuum deposition method (e.g., chemical vapor deposition). For the manufacturing operation, it is moreover an advantage to employ a two step method where the diffusion areas are deposited at one level in a first step (e.g., a metalization step) and the conductor structures are deposited at another level in a second step (e.g., another metalization step). In such a method, the global bit lines can be deposited during either the first step or the second step, or even in a third step (e.g., yet another metalization step).

However, the particular manufacturing process used for fabrication of the contact array structure is not essential to the present invention as long as it provides the described transformation. Normally those who make or use the invention will select the manufacturing process based upon tooling and energy requirements, the expected application requirements of the final product, and the demands of the overall manufacturing process.

Figure 15:
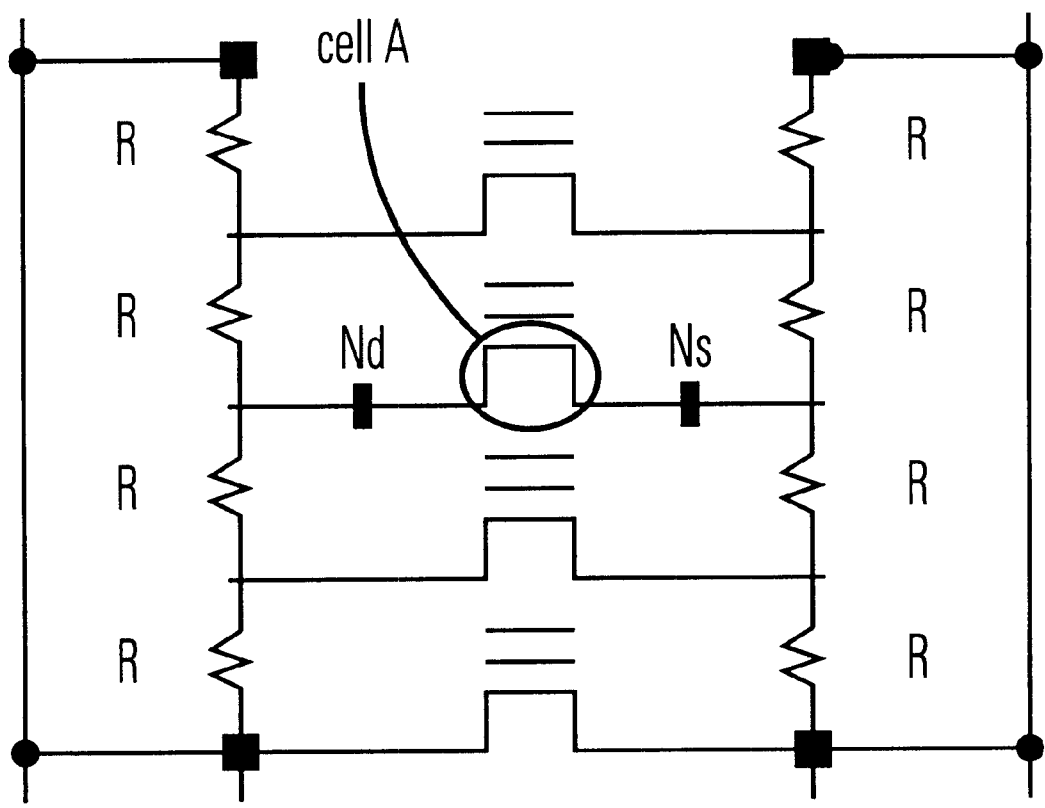
FIG. 15 illustrates a schematic diagram of an equivalent circuit of an array structure, representing an embodiment of the present invention.

FIG. 15 shows an equivalent circuit of the array structure. Referring to FIG. 15, it should be noted that $$Nd=Ns=R$$

where Nd is the resistance from the drain side for Cell A, Ns is the resistance from the source side for Cell A, and R is the sheet resistance of diffusion bit line which is approximately 150/square. The maximum number of wordlines that can be satisfactorily serviced by a single set of inserts is constrained by the maximum permissible bit line resistance. The maximum number of insets is constrained by the space available in a predetermined configuration of cells.

With bit line contact more nearly adjacent to source line contact, the programming current during hot e programing can be reduced due to the body effect of cell A which the threshold voltage will increase at initial stage of program. The cell A threshold voltage during programing (VTE) varies according to the relationship $$VTE=Vfb+2\phi+\gamma(2\phi+Vsb)^{1/2}$$

where Vfb is the flat-band voltage, $\gamma$ is the body effect coefficient, $\phi$ is the potential difference between intrinsic level and Fermi level, and Vsb is the potential difference between the source and the bulk. The flat-band voltage is the voltage that needs to be applied to the gate to keep the Fermi level of the gate the same as the Fermi level of the substrate. The potential difference between the source and the bulk (Vsb) varies according to the relationship $$Vsb=Ir*R$$

where Ir is the programming current. The body effect is the threshold voltage change due to the voltage that is applied to the substrate. The body effect coefficient ($\gamma$) varies according to the relationship $$\gamma=(2qN_A K_{Si}\in_0)^{1/2}/C_{ox}$$

where Na is the substrate doping concentration, $K_{Si}$ is the dielectric constant, $\in_0$ is the permittivity in vacuum, and $C_{ox}$ is the value of an oxide capacitor. The dielectric constant ($K_{Si}$) is approximately 11.8 for silicon (Si) and approximately 3.8 for silica ($SiO_2$).

Preferred embodiments of the invention can have bit line contacts aligned with corresponding source line contacts. This can be termed "bit line contact adjacent to source line contact. " This means that if a bit line contact region is inserted into a given drain region, then a source line contact region should be inserted into the corresponding source region at a position that is directly across a gate region from the bit line contact region. Thus, the source line contact region will be located a minimal distance away from the bit line contact region. In this way, with respect to the wordlines, the source line contact region will be aligned with the bit line contact region. This can be termed "lining up at the same horizontal." Similarly, since each source diffusion area can correspond to two drain diffusion areas, another bit line contact region can be inserted into another corresponding drain region at a position that is directly across another gate region from the source line contact region. Thus, the source line contact region and both of the bit line contract regions can be located along a line (collinear). Optionally, the source line contact region and one, or two, bit line contact regions can be collinear, or even coplanar, with the gate of one, or two, transistor cell(s).

For example, referring again to FIG. 6, the one of the first plurality of contacts 571 is inserted into the first of the pair of drain diffusion areas 550 and the one of the third plurality of contacts 573 is inserted into the source diffusion area 540 directly across the first of the two channel areas 530 from the one of the first plurality of contacts 571. Further, the one of the second plurality of contacts 572, is inserted into the second of the pair of drain diffusion areas 550 directly across the second of the two channel areas 530 from the one of the third plurality of contacts 573. Thus, the one of the first plurality of contacts 571, the one of the third plurality of contacts 573, and the one of the second plurality of contacts are collinear.

Further, they are lined up at the same horizontal. In the particular embodiment shown in FIG. 5, the one of the first plurality of contacts 571, the one of the third plurality of contacts 573, and the one of the second plurality of contacts are not collinear with a gate (no wordlines are visible in the section depicted in FIG. 5).

As another example, referring again to FIG. 14, the contact regions 2116 are collinear. In the particular embodiment shown in FIG. 14, the contact regions 2116 are not collinear with a gate (no wordlines are visible in the section depicted in FIG. 14).

The bit line contacts can be as many as possible to reduce the buried source diffusion bit line and buried drain diffusion bit line resistance. The best case for reducing buried diffusion resistance is one bit line contact and one source line contact with memory cell.

However, the memory size would become too large and unacceptable. Therefore, how to arrange bit line contact and source line contact position is important for obtaining smaller cell size and less voltage drop during high current programing. There are two methods to reduce voltage drop during high current programing. One method is to reduce buried diffusion resistance on the drain and source sides. Another method is to reduce the programing current. The programing current (Ir) varies according to the relationship $$Ir=K/2(Vg-VTE)^2$$

where K is a transconductance parameter, and Vg is the voltage applied on the control gate. If the VTE is increased due to the body effect, then the programing current will be reduced according to the relationship given above. The body effect is strongly dependent on the source contact region position along the source diffusion bit line. With the source contact region and the bit line contact region lined up at the same horizontal, it is possible to obtain a larger strong body effect. This results in higher Vsb and VTE and a smaller cell size.

The disclosed embodiments show a square pillar as the structure for performing the function of contact, but the structure for contacting can be any other structure capable of performing the function of electron conduction, including, by way of example a round pillar, a rectilinear plate or any continuous conduit.

While not being limited to any particular performance indicator or diagnostic identifier, preferred embodiments of the present invention can be identified one at a time by testing for the presence of narrow VT distributions. The test for the presence of narrow VT distribution can be carried out without undue experimentation by the use of a simple and conventional bench top oscilloscope experiment. Among the other ways in which to seek embodiments having the attribute of narrow VT distributions guidance toward the next preferred embodiment can be based on the presence of a minimal distinction between the drain voltage of a first buried cell and the drain voltage of a last buried cell along a diffusion bit line.

Practical Applications of the Invention

A practical application of the present invention that has value within the technological arts is in conjunction with buried type transistors such as, for example, mask ROM, EPROM, FLASH EPROM, and FLASH EEPROM devices. An additional practical application of the present invention that has a value within the technological art is in conjunction with AND cells (see IEDM92, pages 991–993) and ACEE cells (see IEDM90, pages 119–122). An additional practical application of the present invention that has value within the technical arts is in conjunction with virtual ground cells such as, for example, FACE cells (see IEDU90, pages 90–94) and AMG cells (see IEDM91, pages 311–314). There are virtually innumerable uses for the present invention, all of which need not be detailed here.

Advantages of the Invention

A buried transistor array with a contact structure, representing an embodiment of the invention, can be cost effective and advantageous for at least the following reasons. The invention reduces buried diffusion line resistance, particularly in high current applications such as writing with hot electron (hot e) programming on an EPROM or FLASH EPROM. The invention enhances read current and read speed when longer buried diffusion lines are used. This enhancement of read current and speed is particularly beneficial for buried types, such as, for example, MROM, EPROM, FLASH EPROM and FLASH EEPROM types. The invention tightens the voltage-time (VT) distribution, particularly when writing with hot electron programming on an EPROM or FLASH EPROM by putting a contact in communication with the buried diffusion bit line to reduce the drain voltage distinction between the first buried transistor cell and the last buried transistor along a given buried drain diffusion bit line.

All publications, patent applications, and issued patents mentioned in this application are hereby incorporated herein by reference in their entirety to the same extent as if each individual publication, application, or patent was specifically and individually indicated to be incorporated in its entirety by reference.

All the disclosed embodiments of the invention described herein can be realized and practiced without undue experimentation. Although the best mode of carrying out the invention contemplated by the inventors is disclosed above, practice of the present invention is not limited thereto. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Further, although the contact array structure described herein is a physically separate module, it will be manifest that the contact array may be integrated into the circuitry with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the present invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A floating gate memory, comprising a plurality of blocks of floating gate transistor cells, each of said plurality of blocks including a plurality of subarrays of floating gate transistor cells, each of said plurality of subarrays of floating gate transistor cells including:

a first plurality of floating gate transistor cells;

a first drain diffusion bit line coupled to said first plurality of floating gate transistor cells;

a first plurality of contacts coupled to said first drain diffusion deadline;

a first nonglobal conductor coupled to said first plurality of contacts;

a source diffusion bit line coupled to said first plurality of floating gate transistor cells;

a second plurality of contacts coupled to said source diffusion bit line;

a second nonglobal conductor coupled to said second plurality of contacts;

a second plurality of floating gate transistor cells coupled to said source diffusion bit line;

a second drain diffusion bit line coupled to said second plurality of floating gate transistor cells;

a third plurality of contacts coupled to said second drain diffusion bit line; and a third nonglobal conductor coupled to said third plurality of contacts.

2. The floating gate memory of claim 1, wherein at least one of said first plurality of contacts is positioned on said first drain diffusion bit line directly across a first gate region from at least one of said second plurality of contacts that is coupled to said source diffusion bit line.

3. The floating gate memory of claim 2, wherein at least one of said third plurality of contacts is positioned on said second drain diffusion bit line directly across a second gate region from the at least one of said second plurality of contacts that is coupled to said source diffusion bit line.

4. The floating gate memory of claim 1, further comprising a first drain block select transistor coupled to a first end of said first nonglobal conductor.

5. The floating gate memory of claim 1, further comprising a source block select transistor coupled to a first end of said second nonglobal conductor.

6. The floating gate memory of claim 1, further comprising a second drain block select transistor coupled to a first end of said third nonglobal conductor.

* * * * *